(12) United States Patent
Leprettre et al.

(10) Patent No.: US 9,625,503 B2
(45) Date of Patent: Apr. 18, 2017

(54) METHOD AND DEVICE FOR ANALYSING THE QUALITY OF THE ELECTRICAL ENERGY IN A THREE-PHASE ELECTRIC NETWORK

(71) Applicant: SCHNEIDER ELECTRIC INDUSTRIES SAS, Rueil-Malmaison (FR)

(72) Inventors: Benoit Leprettre, La Tronche (FR); Octavian Craciun, Mannheim (DE); Seddik Bacha, Eybens (FR); Pierre Granjon, Vinay (FR); Daniel Radu, Saint Martin D'heres (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 89 days.

(21) Appl. No.: 14/348,736

(22) PCT Filed: Oct. 16, 2012

(86) PCT No.: PCT/FR2012/052351
§ 371 (c)(1),
(2) Date: Mar. 31, 2014

(87) PCT Pub. No.: WO2013/057416
PCT Pub. Date: Apr. 25, 2013

(65) Prior Publication Data
US 2014/0239939 A1    Aug. 28, 2014

(30) Foreign Application Priority Data
Oct. 19, 2011 (FR) ..................... 11 59449

(51) Int. Cl.
G01R 25/00    (2006.01)
G01R 21/06    (2006.01)
(Continued)

(52) U.S. Cl.
CPC .............. *G01R 21/06* (2013.01); *G01R 11/19* (2013.01); *G01R 19/2513* (2013.01);
(Continued)

(58) Field of Classification Search
CPC .... G01R 21/06; G01R 19/2513; G01R 23/20; G01R 29/16; G01R 11/19; G01R 11/40;
(Continued)

(56) References Cited

U.S. PATENT DOCUMENTS 6,615,147 B1    9/2003    Jonker et al.
6,687,627 B1    2/2004    Gunn et al.
(Continued)

FOREIGN PATENT DOCUMENTS

WO    2004 081591    9/2004

OTHER PUBLICATIONS

Guibin Zhang, "A New Real-time Negative and Positive Sequence Components Detecting Method Based on Space Vector", 2001, (C) IEEE, vol. 1, pp. 275-280.*
(Continued)

*Primary Examiner* — Huy Q Phan
*Assistant Examiner* — Raul Rios Russo
(74) *Attorney, Agent, or Firm* — Oblon, McClelland, Maier & Neustadt, L.L.P.

(57) ABSTRACT

A method for analyzing quality of electrical energy in a three-phase electric network, the method including: measuring a set of electrical magnitudes, the set including one electrical magnitude per phase; forming a space vector from an instantaneous three-dimensional transformation of the set of measured electrical magnitudes; and determining a set including at least one parameter representative of the quality of the electrical energy in the three-phase electric network, according to the space vector.

17 Claims, 2 Drawing Sheets

(51) Int. Cl.
*G01R 11/19* (2006.01)
*G01R 19/25* (2006.01)
*G01R 29/16* (2006.01)
*H01F 30/12* (2006.01)
*G01R 23/20* (2006.01)

(52) U.S. Cl.
CPC .............. *G01R 29/16* (2013.01); *G01R 23/20* (2013.01); *H01F 30/12* (2013.01)

(58) Field of Classification Search
CPC .. H01F 30/12; H01H 71/7445; H02P 2209/05
USPC ...... 324/72, 76.11–76.83, 86, 108, 141, 160, 324/500–537; 702/57–127
IPC .................................................. H02P 2209/05
See application file for complete search history.

(56) References Cited

U.S. PATENT DOCUMENTS

| | | | |
|---|---|---|---|
| 2003/0014200 A1 | 1/2003 | Jonker et al. | |
| 2003/0016004 A1* | 1/2003 | Jungwirth | G01R 19/2513 324/113 |
| 2005/0027464 A1 | 2/2005 | Jonker et al. | |
| 2005/0162170 A1 | 7/2005 | Tarkiainen | |
| 2005/0231871 A1* | 10/2005 | Karimi Ghartemani | H02H 1/0092 361/86 |
| 2006/0066456 A1 | 3/2006 | Jonker et al. | |
| 2006/0145653 A1* | 7/2006 | Sarlioglu | H02H 7/0833 318/811 |
| 2007/0013329 A1* | 1/2007 | Sieber | H02P 23/12 318/135 |
| 2007/0296381 A1* | 12/2007 | Conticelli et al. | 323/237 |
| 2009/0150686 A1* | 6/2009 | Muthu-Mannivannan | H02H 3/04 713/300 |
| 2011/0118616 A1* | 5/2011 | Vajdic | A61B 5/04011 600/509 |
| 2011/0251732 A1* | 10/2011 | Schweitzer, III | H02J 3/12 700/297 |
| 2012/0106223 A1* | 5/2012 | Janning et al. | 363/154 |
| 2013/0051498 A1* | 2/2013 | Taft | G01R 19/2513 375/340 |
| 2013/0183866 A1* | 7/2013 | Poulain et al. | 439/660 |
| 2015/0137990 A1* | 5/2015 | Riche | G01D 4/00 340/870.03 |

OTHER PUBLICATIONS

Ferrero, A. et al. "A Park-Vector Approach to Displacement and Distortion in Three-Phase Systems: the Role of the Power Factor and the Imaginary Power" 11$^{th}$ International Conference on Harmonics and Quality of Power, IEEE, pp. 745- 752, 2004 XP010778570.

Chattopadhyay, S. et al. "Power Quality Assessment in V-V, Clarke and Park Domain" Universities Power Engineering Conference, UPEC, 42$^{nd}$ International, IEEE, pp. 669-676, 2007 XP031237603.

Hao, R. et al. "A Novel Harmonic Currents Detection method Based on Rotating d-q Reference Frame for Active Power Filter" 35$^{th}$ Annual IEEE Power Electronics Specialists Conference, pp. 3034-3038, 2004 XP010739749.

Kong, S. et al. "Design of Voltage Unbalance Generating Device Based on Negative Sequence Injection Method" 5$^{th}$ IEEE Conference on Industrial Electronics and Applicationsis, pp. 1305-1308, 2010 XP 031711732.

International Search Report Issued Jan. 28, 2013 in PCT/FR12/052351 Filed Oct. 16, 2012.

Power System Analysis Using Space Vector Transformation, Jose Aller et al., Article in IEEE Power Engineering Review Sep. 2002 (Publication IEEE Transactions on Power Systems, vol. 17, No. 4, Nov. 2002), pp. 957-965.

* cited by examiner

METHOD AND DEVICE FOR ANALYSING THE QUALITY OF THE ELECTRICAL ENERGY IN A THREE-PHASE ELECTRIC NETWORK

BACKGROUND

The present invention relates to analysis of the quality of the electrical energy in an electric power network.

In general manner, the quality of the electrical energy in a power network can be represented by a combination between the quality of the voltage and the quality of the current. However, for a three-phase system, the quality of the electrical energy is more complex to define. A three-phase electric power system is in fact considered to be healthy, or not disturbed, if the wave form, amplitude, frequency and symmetry respectively remain within predefined limits.

Furthermore, determining electrical values such as the rms current or voltage value, total active power, total apparent power, total reactive power, in particular enables the energy consumption of an installation to be controlled.

The present invention relates more particularly to three-phase power systems. The most common disturbances which affect the latter are voltage or current sags, voltage surges or overcurrents, harmonic pollution, unbalances and voltage flicker.

STATE OF THE PRIOR ART

Known methods for monitoring the quality of the electrical energy in a three-phase electric power system consist in phase-by-phase analysis of the disturbances and of the electrical values.

To globally characterize the consumption and quality of the electrical energy in a three-phase power system, known methods consist in summing or averaging the results obtained for each phase. These methods are not however totally satisfactory. The result of a measurement on a phase is not in fact always relevant in a three-phase power system. If for example an arithmetic mean is made of measurement results made phase by phase, a characterization of the three-phase power system from the physical point of view is not necessarily obtained. Furthermore, when summing of single-phase quantities is performed, measurement errors accumulate.

The document EP 0,599,648 describes a method for computing the positive, negative and zero sequence components in a three-phase electric power system to detect an unbalance. This unbalance detection is based on calculations that are complex, long and not very accurate. It does not enable an unbalance factor to be quantified. Finally, this document only deals with unbalances and does not take all the disturbances that can affect a three-phase electric power system into account.

Known methods and devices therefore do not enable a global three-phase measurement of the quality of the electrical energy in a three-phase power system to be made.

SUMMARY OF THE INVENTION

The object of the invention is to solve the problems of the prior technique by providing a method for analysing the quality of the electrical energy in a three-phase electric power system, characterized in that it comprises the steps of:

Measuring a set of electrical quantities, the set comprising one electrical quantity per phase, Forming a space vector from an instantaneous three-dimensional transformation of the set of measured electrical quantities, Determining a set comprising at least one parameter representative of the quality of the electrical energy in the three-phase electric power system, according to the space vector.

Correlatively, the invention relates to a device for analysing the quality of the electrical energy in a three-phase electric power system, characterized in that it comprises:

Means for measuring a set of electrical quantities, the set comprising one electrical quantity per phase, Means for forming a space vector from an instantaneous three-dimensional transformation of the set of measured electrical quantities, Means for determining a set comprising at least one parameter representative of the quality of the electrical energy in the three-phase electric power system, according to the space vector.

By means of the invention, it is possible to quantify and to characterize the different types of electrical disturbances able to occur in a three-phase power system in global manner.

The precision and computing time are significantly improved.

It is thus possible to monitor the quality of the electrical energy in a three-phase power system in a more precise and quicker manner. This enables the origin of any disturbances that may occur to be better understood and their impact on the electrical equipment present in the power system to be better evaluated.

The invention is based on determination and use of the space vector, which contains all the information of the three-phase system.

According to a preferred feature, the set comprising at least one parameter representative of the quality of the electrical energy in the three-phase electric power system comprises at least one parameter chosen from:

a parameter representative of a voltage or current unbalance in the three-phase power system, a parameter representative of a voltage or current sag, a parameter representative of a voltage surge or of an overcurrent, a parameter representative of a voltage flicker.

These parameters represent the disturbances that are the most common and the most relevant for analysis of the quality of the electrical energy in a three-phase power system.

According to a preferred feature, the method for analysing further comprises formation of a zero sequence component from the instantaneous three-dimensional transformation of the set of measured electrical quantities.

In this case, determination of the set comprising at least one parameter representative of the quality of the electrical energy in the three-phase electric power system is further performed according to the zero sequence component and said at least one parameter represents a harmonic voltage or current pollution.

According to a preferred feature, the method further comprises determination of at least one energy parameter of the three-phase electric power system according to the space vector and to the zero sequence component.

According to a preferred feature, the at least one energy parameter is chosen from:

A total rms current or voltage value,

A total active power,

A total apparent power,

A total reactive power.

The energy parameters enable the three-phase energy consumptions to be determined by integration in time.

According to a preferred feature, the method further comprises a display step of a form followed by the space vector in the complex plane.

This type of display gives a visual indication of the presence of a disturbance that is very quick to detect for a user.

The device comprises means for implementing these features and presents similar advantages.

In a particular embodiment, the steps of the method according to the invention are implemented by computer program instructions.

Consequently, it is a further object of the invention to provide a computer program on a data medium, this program being able to be implemented in a computer, this program comprising instructions suitable for implementation of the steps of a method as described in the foregoing.

This program can use any programming language and be in the form of source code, object code, or intermediate code between source code and object code, such as in partially compiled form, or in any other desirable form.

A further object of the invention is to provide a data medium able to be read by a computer and comprising computer program instructions.

The data medium can be any entity or device able to store the program. For example, the medium can comprise storage means, such as a ROM, for example a CD-ROM or a microelectronic circuit ROM, or a magnetic recording means, for example a floppy disk or a hard disk.

The data medium can further be a transmissible medium such as an electric or optic signal which can be conveyed via an electric or optic cable, by radio or by other means. The program according to the invention can in particular be downloaded from a network of Internet type.

Alternatively, the data medium can be an integrated circuit in which the program is incorporated, the circuit being suitable for executing or for being used in execution of the method according to the invention.

BRIEF DESCRIPTION OF THE DRAWINGS

Other features and advantages will become apparent from reading of a preferred embodiment given for non-restrictive example purposes only, described with reference to the figures in which.

DETAILED DESCRIPTION OF PARTICULAR EMBODIMENTS

Figure 1:
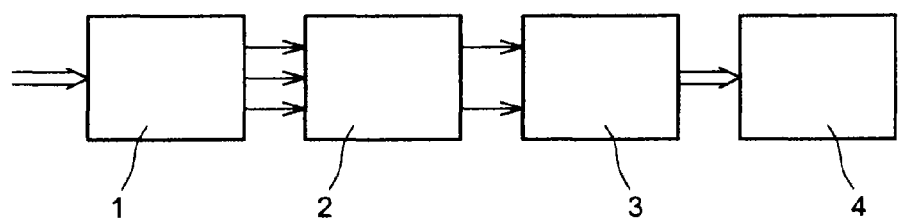
FIG. 1 represents a device for analysing the quality of the electrical energy in a three-phase power system, according to the invention.

According to the embodiment represented in FIG. 1, a device for analysing the quality of the electrical energy in a three-phase power system comprises a data acquisition module 1. Module 1 comprises an input interface designed to be connected to each phase of the three-phase electric power system to measure electrical quantities of the latter at a point of the power system. The quantities are the instantaneous voltages and/or instantaneous currents of the phases. These measurements in themselves are conventional and will not be dealt with in detail here. It is assumed in the following that the power system is a three-phase power system.

Module 1 comprises an output interface which is connected to an input interface of an instantaneous three-dimensional transformation module 2. Module 1 transmits to module 2 as many measured electrical quantities as the power system comprises phases. These electrical quantities are voltage and/or current values.

At a given time, module 2 receives three measurements $x_a(t)$, $x_b(t)$ and $x_c(t)$ which are the instantaneous values of the phase voltages or of the phase currents measured at a point of the three-phase power system. Module 2 performs a transformation derived from that of the symmetric components and defined by Clarke's transformation:

$$\begin{bmatrix} x_\alpha(t) \\ x_\beta(t) \\ x_0(t) \end{bmatrix} = k \cdot \begin{bmatrix} 1 & -1/2 & -1/2 \\ 0 & \frac{\sqrt{3}}{2} & -\frac{\sqrt{3}}{2} \\ 1/2 & 1/2 & 1/2 \end{bmatrix} \cdot \begin{bmatrix} x_a(t) \\ x_b(t) \\ x_c(t) \end{bmatrix}$$

The first two components obtained after transformation are combined to form a time-dependent complex number called space vector:

$$\vec{x}(t) = x_\alpha(t) + j \cdot x_\beta(t)$$

These two equations form the instantaneous three-dimensional transformation. The space vector contains all the data of the original three-phase system.

When the three-phase system is balanced, the space vector follows a circle in the complex plane. A disturbance causes a deformation of the space vector visible in the complex plane. The deformations enable the different disturbances affecting the three-phase electric system to be characterized and quantified.

The instantaneous three-dimensional transformation also results in the zero sequence component $x_0(t)$ which is a quantity with a real value.

Module 2 comprises an output interface which is connected to an input interface of a module 3 for determining at least one parameter representative of the quality of the electrical energy in the three-phase electric power system. Module 2 transmits the space vector and possibly the zero sequence component to module 3. In the following, unless stipulated otherwise, both a voltage space vector and a zero sequence voltage component and a current space vector and a zero sequence current component are involved.

Module 3 receives the space vector and the zero sequence component if this is the case and uses them to determine one or more parameters representative of the quality of the electrical energy. It should be noted that, as set out in the following, depending on the parameter which is determined, the zero sequence component is not always necessary. If the zero sequence component is not necessary, module 2 does not necessarily transmit it to module 3.

The computations performed by module 3 can be performed according to the IEC 61000-4-30 standard: Electromagnetic compatibility (EMC)—part 4-30: Testing and measurement techniques—Power quality measurement methods.

Figure 2:
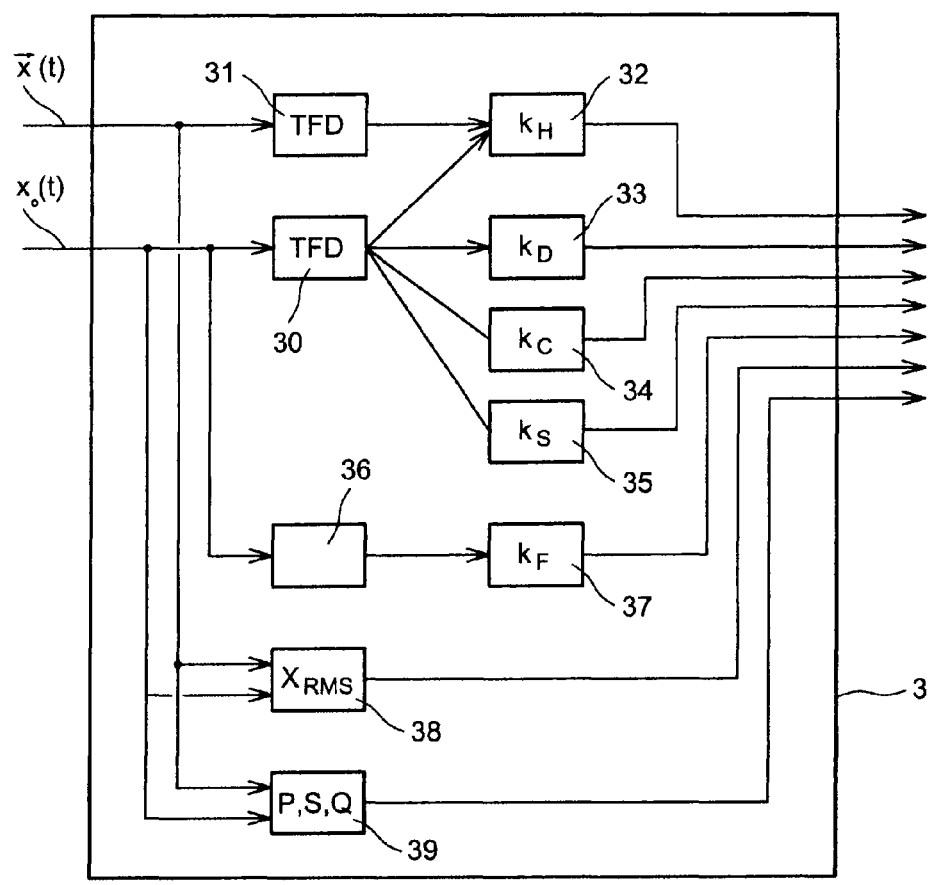
FIG. 2 represents a computing module of the device of FIG. 1.

With reference to FIG. 2, module 3 determines one or more parameter(s) representative of the quality of the electrical energy in the power system.

These parameters are chosen from:
- A three-phase harmonic distortion factor $k_H$, which represents the harmonic voltage or current pollution,
- A three-phase unbalance factor $k_D$, which represents the voltage or current unbalances,
- A three-phase voltage or current sag indicator $k_C$, which represents the voltage or current sag,
- A three-phase voltage surge or overcurrent indicator $k_S$, which represents the voltage surges or overcurrents,
- A voltage flicker factor $k_F$, which represents the voltage flicker.

Computation of each of these parameters uses the space vector. For the voltage or current harmonic distortion factor $k_H$, the zero sequence component is in addition used. Details of determination of these parameters are presented in the following.

Sub-modules 30 and 31 of module 3 respectively receive the space vector and the zero sequence component from module 2 and each apply a Fourier transform thereto. Sub-modules 30 and 31 respectively deliver the amplitude spectra of these two quantities on output. It is to be noted that sub-module 31 in practice performs a Fourier transform for the real part of the space vector and a Fourier transform for its imaginary part.

The harmonic content of a three-phase system can be analysed from the space vector and the zero sequence component.

The amplitudes of the harmonics at each frequency are used to compute the global harmonic distortion factor $k_H$ of the three-phase system.

The harmonics are distributed in the space vector and/or zero sequence component spectrum at given frequencies, according to their rank n and their distribution over the three phases.

The global harmonic distortion factor $k_H$ of the three-phase system is computed by a sub-module 32 of module 3, the inputs of which are connected to the outputs of sub-modules 30 and 31, according to the following formula:

$$k_H = \frac{\sqrt{\sum_{n=2}^{\infty} (|X_d^n|^2 + |X_i^n|^2 + |X_h^n|^2)}}{\sqrt{(|X_d^1|^2 + |X_i^1|^2 + |X_h^1|^2)}} \cdot 100 \; [\%]$$

where $X_d^n$, $X_i^n$ and $X_h^n$ are the positive, negative and zero sequence components of the harmonic of rank n, which are computed by Fourier transform of the space vector and of the zero sequence component. These components can include the content of adjacent frequencies on each side of the $n^{th}$ harmonic, as described in the IEC 61000-4-30 standard.

The denominator of the above formula represents the rms value of the set of three-phase harmonic components of rank equal to 1. The numerator represents the rms value of the set of three-phase harmonic components of rank higher than 1.

The global harmonic distortion factor $k_H$ of the three-phase system is estimated over a sliding window on which the space vector and zero sequence component spectra are computed and the factor formula $k_H$ is then applied.

The duration of the window is for example 200 ms, in compliance with the IEC 61000-4-30 standard. This time period satisfies two opposing criteria:

It is sufficiently short to minimize the processing response time and to enable fast variations of the factor $k_H$ to be monitored;

It is sufficiently long to have a satisfactory spectral resolution to correctly separate the components contained in the analysed signals. The resolution is the opposite of the duration of the window and is therefore 5 Hz.

The voltage or current unbalance in a three-phase system is determined from the voltage or current space vector by a sub-module 33 of module 3, an input of which is connected to the output of sub-module 30.

An unbalance in a three-phase system is defined by the IEC 61000-4-30 standard as the ratio between the positive voltage or current and the negative voltage or current, at the fundamental frequency of the three-phase system.

The three-phase unbalance factor $k_D$ therefore represents the ratio of the modules of the positive component and of the negative component at the fundamental frequency of the three-phase system.

A Fourier transform is applied to the space vector by sub-module 30 which delivers the amplitude spectrum of this quantity to sub-module 33. The latter then uses the positive and negative components at the fundamental frequency according to the following formula:

$$k_D = \frac{|X_i^1|}{|X_d^1|} \cdot 100 \; [\%]$$

As a variant, it is possible to compute the unbalance factors associated with the harmonics of the three-phase system by applying the above formula for the required harmonic frequencies.

The unbalance factor is also computed over a sliding window having a duration for example of 200 ms. Computation is thus performed in real time. The time period of the window can be chosen in compliance with the IEC 61000-4-30 standard and enables both a good spectral resolution (5 Hz) and a short response time for detection of unbalances to be obtained.

Voltage or current sags are determined from the space vector by a sub-module 34 of module 3, an input of which is connected to the output of sub-module 30. Voltage sags are dealt with in the following, knowing that the calculations are transposable to the case of current sags.

In the absence of voltage sags in the three-phase power system, the voltage space vector covers a circle having a radius equal to the rated voltage $V_{nom}$ in the complex plane, at the fundamental frequency of the power system.

When a voltage sag occurs, the voltage space vector covers an ellipse the minor radius of which is smaller than the rated voltage $V_{nom}$ in the complex plane, at the fundamental frequency. The smaller the minor radius of the ellipse, the greater the sag.

The voltage sag indicator $k_C$ is the ratio between the minor radius of the ellipse and the rated voltage $V_{nom}$. The voltage sag indicator is determined from the space vector to which a Fourier transform is applied by sub-module 30. The amplitude spectrum of this quantity is thus obtained. Sub-module 30 delivers the latter to sub-module 34 which then determines the modules of the positive and negative components at the fundamental frequency and uses them according to the following formula:

$$k_C = \frac{|X_d^1| - |X_i^1|}{V_{nom}}$$

The voltage sag indicator $k_C$ is equal to the difference of the positive component module and of the negative component module at the fundamental frequency, divided by the value of the rated voltage of the power system.

In practice, the calculations are made over a sliding window the time length of which is for example equal to two periods of the fundamental. This window size enables the space vector spectrum to be correctly estimated, while at the same time rapidly detecting the occurrence of a sag.

When the voltage sag indicator $k_C$ remains close to 1, for example remaining higher than a threshold equal to 0.9, there is no sag.

When the voltage sag indicator $k_C$ drops below the set threshold for a given time period, for example at least one fundamental half-period, a sag is detected. The closer the voltage sag indicator $k_C$ is to 0, the greater or deeper the sag.

The value of the detection threshold and the minimum duration of the sag are for example chosen so as to be in compliance with class A defined in the ICE 61000-4-30 standard. They can be adjustable by the user.

Voltage surges or overcurrents are determined from the space vector by a sub-module 35 of module 3, an input of which is connected to the output of sub-module 30.

Voltage surges are dealt with in the following, knowing that the calculations are transposable to the case of overcurrents.

In the absence of a voltage surge in the three-phase power system, the voltage space vector covers, in the complex plane, a circle having a radius that is equal to the rated voltage $V_{nom}$, at the fundamental frequency of the power system.

When a voltage surge occurs, the voltage space vector covers, in the complex plane, an ellipse the minor radius of which is greater than the rated voltage $V_{nom}$, at the fundamental frequency. The larger the minor radius of the ellipse, the higher the voltage surge.

The voltage surge indicator $k_S$ is determined from the space vector to which a Fourier transform is applied by sub-module 30. The amplitude spectrum of this quantity is obtained. Sub-module 30 delivers the latter to sub-module 35 which then determines the modules of the positive and negative components at the fundamental frequency and uses them according to the following formula:

$$k_S = \frac{|X_d^1| + |X_i^1|}{V_{nom}}$$

The voltage surge indicator $k_S$ is equal to the sum of the positive component module and of the negative component module at the fundamental frequency, divided by the value of the rated voltage of the power system.

In practice, the calculations are made over a sliding window the time length of which is for example equal to two periods of the fundamental. This window size enables the space vector spectrum to be correctly estimated, while at the same time rapidly detecting the occurrence of a voltage surge.

When the voltage surge indicator $k_S$ remains close to 1, for example remaining lower than a threshold equal to 1.1, there is no voltage surge.

When the voltage surge indicator $k_S$ exceeds the set threshold for a given time period, for example at least one fundamental half-period, a voltage surge is detected. The higher the voltage surge indicator $k_S$, the greater the voltage surge.

The value of the detection threshold and the minimum duration of the voltage surge are for example chosen so as to be in compliance with class A defined in the IEC 61000-4-30 standard. They can be adjustable by the user.

Voltage flicker is measured from the space vector by a sub-module 37 of module 3.

In conventional manner, the voltage flicker is measured for a phase by an apparatus called flickermeter. The input of the flickermeter is a phase voltage which is a quantity with a real value.

According to the invention, a sub-module 36 is connected to the input of module 3. Sub-module 36 receives the space vector voltage. It determines the real part of the space vector voltage and then delivers it to the input of sub-module 37 which is a flickermeter. It is thus the three-phase data contained in the real part of the space vector voltage which enables the voltage flicker to be analysed. The flickermeter 37 delivers on output a flicker factor $k_F$ which is a global measurement of the voltage flicker of the three-phase system.

In practice, the computations are made over a sliding window the time length of which is for example equal to 500 ms. Even if the IEC 61000-4-15 standard stipulates that the observation period for voltage flicker can be chosen from the following values: 1 nm, 5 mn, 10 mn and 15 mn, a short observation time enables rapid detection of flicker and better monitoring of rapid voltage flicker.

According to a preferred embodiment, module 3 further enables at least one energy parameter to determined such as the total rms values of the voltage and/or of the current and the different total powers, such as the total active, reactive and apparent powers. These powers act as basis for computation of the energy consumption of the three-phase system.

A sub-module 38 is connected to the input of module 3 and receives the space vector and zero sequence component of the voltage and/or of the current. Sub-module 38 determines the total rms value either of the voltage or of the current, globally for the three-phase power system, according to the following formula:

$$x_{RMS} = \sqrt{\mu_T\left(\frac{x_\alpha^2(t) + x_\beta^2(t)}{2} + x_0^2(t)\right)}$$

where the operator PT represents the averaging operation over a time period T preferably equal to an integer number of times of the fundamental period of the three-phase electric power system.

A total rms voltage value $V_{RMS}$ and/or a total rms current value $I_{RMS}$ can thus be determined.

A sub-module 39 is connected on input of module 3 and receives the space vector and zero sequence component of the voltage and of the current. Sub-module 39 determines at least one total power representative of the three-phase system.

The total three-phase active power P is computed according to the formula:

$$P = \frac{3}{2} \cdot \mu_T\left(\vec{i}(t) * \vec{v}(t)\right) + 3 \cdot \mu_T(i_0(t) \cdot v_0(t))$$

where $\vec{i}(t)$ and $\vec{v}(t)$ are respectively the current space vector and the voltage space vector, and the operator * represents the scalar product.

The total three-phase apparent power S is computed according to the formula:

$$S = 3 \cdot V_{RMS} \cdot I_{RMS}$$

where $V_{RMS}$ is the total rms voltage value, and $I_{RMS}$ is the total rms current value.

The total three-phase reactive power Q is computed according to the formula:

$$Q = \pm \sqrt{S^2 - P^2}$$

The sign of the total three-phase reactive power Q can be determined from a power analysis at the fundamental, using a discreet Fourier transform at the fundamental frequency of the power system.

As a variant, the total three-phase reactive power Q can be determined in similar manner to the total three-phase active power P, but using a voltage or current signal calculated in quadrature with respect to the original signal.

A total three-phase energy consumption can be determined from these power measurements by integration in time.

Each of the computation sub-modules 32 to 37 and 38 and 39 described above has an output connected to an input of a results display module 4.

Display of the results can be more or less precise according to the user's requirements. The display read-out can for example thus simply indicate the absence or presence of disturbances in the three-phase electric power system. For example, the shape followed by the space vector in the complex plane is displayed. The further this shape deviates from that of a circle, the more the three-phase electric power system is disturbed, i.e. the voltage and/or current are non-sinusoidal and/or unbalanced.

As a variant, a binary display can be associated with each of the parameters determined according to the invention.

The display can also give an indication of the level of seriousness of the detected disturbances, for example by a colour code or a cursor on a graduated scale.

The display can also provide a precise quantification of the detected disturbances, for example by means of curve plots and/or numerical values.

Visual or audible alarms can be associated with threshold overshoots by the parameters determined according to the invention.

Module 4 preferably provides the user with a suitable interface which enables him to select one or more parameters to be monitored, as well as one of these precision levels for each parameter.

Module 4 can integrate or be connected to a memory (not represented) to store the results provided by module 3.

Figure 3:
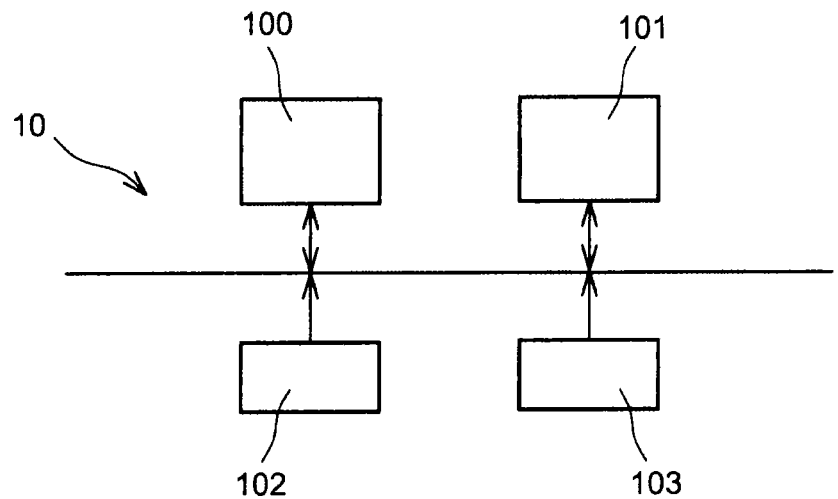
FIG. 3 represents an embodiment of the device according to the invention.

FIG. 3 represents a particular embodiment of the device according to the invention.

The device 10 has the general structure of a computer. It comprises in particular a processor 100 executing a computer program implementing the method according to the invention, a memory 101, an input interface 102 and an output interface 103 to display the results of the computations performed by the processor.

These different elements are conventionally connected by a bus.

The input interface 102 is designed to be connected to the phases of the three-phase power system so as to perform voltage and/or current measurements.

The processor 100 executes the processing operations explained in the foregoing with reference to FIGS. 1 and 2. These processing operations are performed in the form of computer program code instructions which are stored by the memory 101 before being executed by the processor 100.

The memory 101 can further store the results of the processing operations performed.

The output interface 103 enables the results to be displayed or as a variant enables connection to a read-out.

Figure 4:
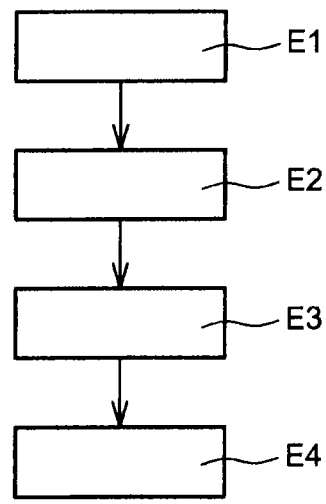
FIG. 4 represents an embodiment of the method for analysing the quality of the electrical energy in a three-phase power system, according to the invention.

With reference to FIG. 4, the method for analysing the quality of the electrical energy in a three-phase electric power system according to the invention, implemented by the device described in the foregoing, comprises steps E1 to E4.

Step E1 performs data acquisition. It is assumed that the input interface of the module 1 has been previously connected to each phase of the three-phase electric power system to measure instantaneous electrical quantities of the latter at a point of the power system. These quantities are the voltages and/or currents of the phases.

Step E1 is followed by step E2 which performs instantaneous three-dimensional transformation of the previously measured quantities. The result is the space vector and zero sequence component.

The following step E3 comprises determining of at least one parameter representative of the quality of the electrical energy in the three-phase electric power system, according to the space vector.

If necessary, this determining is in addition performed according to the zero sequence component.

The parameters that can be determined are chosen from:
A three-phase harmonic distortion factor $k_H$, which represents the harmonic voltage or current pollution,
A three-phase unbalance factor $k_D$, which represents the voltage or current unbalances,
A three-phase voltage or current sag indicator $k_C$, which represents the voltage or current sags,
A three-phase voltage surge or overcurrent indicator $k_S$, which represents the voltage surges or overcurrents,
A voltage flicker factor $k_F$, which represents the voltage flicker.

The computations to determine these parameters are those set out in the foregoing.

Step E3 can further comprise determining of at least one energy parameter of the three-phase electric power system according to the space vector and zero sequence component.

The energy parameters which can be determined are chosen from:
the total rms values of the voltage and/or of the current,
different total powers, such as the total active, reactive and apparent power. These powers act as basis for computation of the energy consumption of the three-phase system.

The computations to determine these parameters are those set out in the foregoing.

Preferably, step E3 comprises prior configuration in which the user selects the parameter or parameters he wishes to determine by means of a suitable user interface.

Step E3 is followed by step E4 which is display of the results of step E3. As set out in the foregoing, display can be performed with several levels of detail. It can furthermore comprise alarms in case of detection of disturbances.

The invention applies to rapid and precise detection of the different disturbances in three-phase electric power systems.

It also enables detection of the presence of polluting sources and the direction of propagation of the disturbances they generate, particularly in a power system of large size.

The invention enables for example disturbances caused by wind power generators in a power system to be monitored. A wind power generator typically causes harmonic pollution and voltage fluctuations of flicker type.

The inventors have shown experimentally that the invention enables these disturbances to be detected.

The invention claimed is:

1. A method for analyzing quality of electrical energy in a three-phase electric power system to determine absence or presence of disturbance in the three-phase electric power system, the method comprising:
   measuring a set of electrical quantities, the set including one electrical quantity per phase;
   generating, by processing circuitry of an analyzing device, a space vector, which is a time-dependent complex number, from an instantaneous three-dimensional transformation of the set of measured electrical quantities, the space vector being generated over a sliding window; and
   determining, by the processing circuitry, according to the generated space vector, a set including at least one parameter representative of the quality of the electrical energy in the three-phase electric power system to determine the absence or the presence of disturbance in the three-phase electric power system, the at least one parameter including a parameter representative of voltage flicker.

2. The method for analyzing according to claim 1, wherein the at least one parameter representative of the quality of the electrical energy in the three-phase electric power system further includes at least one of:
   a parameter representative of a voltage or current unbalance in the three-phase power system,
   a parameter representative of a voltage or current sag, and
   a parameter representative of a voltage surge or of an overcurrent.

3. The method for analyzing according to claim 1, further comprising generating a zero sequence component from the instantaneous three-dimensional transformation of the set of measured electrical quantities.

4. The method for analyzing according to claim 3, wherein the determining the set including the at least one parameter representative of the quality of the electrical energy in the three-phase electric power system is further performed according to the zero sequence component, and the at least one parameter represents a harmonic voltage or current pollution.

5. The method for analyzing according to claim 3, further comprising determining at least one energy parameter of the three-phase electric power system according to the space vector and the zero sequence component.

6. The method for analyzing according to claim 5, wherein the at least one energy parameter includes at least one of:
   a total rms current or voltage value,
   a total three-phase active power,
   a total three-phase apparent power, and
   a total three-phase reactive power.

7. The method for analyzing according to claim 1, further comprising displaying a shape followed by the space vector in the complex plane.

8. The method for analyzing according to claim 7, further comprising:
   analyzing, by processing circuitry of the analyzing device,
      a deviation in the shape followed by the space vector, a degree of deviation in the shape corresponding to a level of disturbance in the three-phase electric power system.

9. The method for analyzing according to claim 1, wherein the sliding window has a time duration of 200 milliseconds.

10. A device for analyzing quality of electrical energy in a three-phase electric power system, the device comprising:
    processing circuitry configured to
       measure a set of electrical quantities, the set including one electrical quantity per phase,
       generate a space vector, which is a time-dependent complex number, from an instantaneous three-dimensional transformation of the set of measured electrical quantities, the space vector being generated over a sliding window, and
       determine, according to the generated space vector, a set including at least one parameter representative of the quality of the electrical energy in the three-phase electric power system, the at least one parameter including a parameter representative of voltage flicker.

11. The device for analyzing according to claim 10, wherein the at least one parameter representative of the quality of the electrical energy in the three-phase electric power system further includes at least one of:
    a parameter representative of a voltage or current unbalance in the three-phase power system,
    a parameter representative of a voltage or current sag, and
    a parameter representative of a voltage surge or an overcurrent.

12. The device for analyzing according to claim 10, wherein the processing circuitry is further configured to generate a zero sequence component from the instantaneous three-dimensional transformation of the set of measured electrical quantities.

13. The device for analyzing according to claim 12, wherein the processing circuitry that determines the set including the at least one parameter representative of the quality of the electrical energy in the three-phase electric power system is configured to further determine the set according to the zero sequence component and is further configured to determine a parameter representative of a harmonic voltage or current pollution.

14. The device for analyzing according to claim 12, wherein the processing circuitry is further configured to determine at least one energy parameter of the three-phase electric power system according to the space vector and zero sequence component.

15. The device for analyzing according to claim 14, wherein the at least one energy parameter includes at least one of:
    a total rms current or voltage value,
    a total three-phase active power,
    a total three-phase apparent power, and
    a total three-phase reactive power.

16. The device for analyzing according to claim 10, wherein the processing circuitry is further configured to display a shape covered by the space vector in the complex plane.

17. A non-transitory recording medium including computer executable instructions, wherein the instructions, when executed by a computer, cause the computer to perform a method for analyzing quality of electrical energy in a three-phase electric power system to determine absence or presence of disturbance in the three-phase electric power system, the method comprising:

measuring a set of electrical quantities, the set including one electrical quantity per phase;

generating a space vector, which is a time-dependent complex number, from an instantaneous three-dimensional transformation of the set of measured electrical quantities, the space vector being generated over a sliding window; and determining, according to the generated space vector, a set including at least one parameter representative of the quality of the electrical energy in the three-phase electric power system to determine the absence or the presence of disturbance in the three-phase electric power system, the at least one parameter including a parameter representative of voltage flicker.

* * * * *